United States Patent
Parnami et al.

(10) Patent No.: US 9,312,834 B1
(45) Date of Patent: Apr. 12, 2016

(54) LOW LEAKAGE FLIP-FLOP CIRCUIT

(71) Applicants: Mohit Parnami, Noida (IN); Gaurav Goyal, Greater Noida (IN)

(72) Inventors: Mohit Parnami, Noida (IN); Gaurav Goyal, Greater Noida (IN)

(73) Assignee: FREESCALE SEMICONDUCTORS, INC., Austin, TX (US)

( * ) Notice: Subject to any disclaimer, the term of this patent is extended or adjusted under 35 U.S.C. 154(b) by 0 days.

(21) Appl. No.: 14/591,924

(22) Filed: Jan. 8, 2015

(51) Int. Cl.
*H03K 3/356* (2006.01)
*H03K 3/3562* (2006.01)

(52) U.S. Cl.
CPC .................................. *H03K 3/35625* (2013.01)

(58) Field of Classification Search
CPC ............ H03K 3/35625; H03K 3/0372; H03K 3/0375; H03K 3/012; H03K 3/3562
USPC .................. 327/198–203, 207, 208, 212, 225
See application file for complete search history.

(56) References Cited

U.S. PATENT DOCUMENTS

| | | | |
|---|---|---|---|
| 7,138,842 B2 | 11/2006 | Padhye et al. | |
| 7,164,301 B2 | 1/2007 | Chun | |
| 7,583,121 B2 | 9/2009 | Berzins et al. | |
| 7,791,389 B2 | 9/2010 | Remington | |
| 8,330,518 B2 | 12/2012 | Veggetti et al. | |
| 8,604,853 B1 | 12/2013 | Jarrar et al. | |
| 8,816,741 B2 | 8/2014 | Liu et al. | |
| 2013/0178700 A1* | 7/2013 | Sakai | A61B 1/00016 600/101 |

OTHER PUBLICATIONS

Rubil Ahmadi, "A Power Efficient Hold-Friendly Flip-Flop", IEEE 978-1-4244-2332-3/08, 2008.
Sin-Yu Chen, Rung-Bin Lin, Hui-Hsiang Tung, Kuen-Wey Lin, "Power Gating Design for Standard-Cell-Like Structured ASICS", EDAA 978-3-9810801-6-2, Oct. 2010.

* cited by examiner

*Primary Examiner* — Diana J Cheng
(74) *Attorney, Agent, or Firm* — Charles E. Bergere

(57) ABSTRACT

An integrated circuit having reduced power consumption includes a clock-gating cell, a transistor and a flip-flop. The clock-gating cell receives a dynamic enable signal, generates a latched-enable signal and gates a clock signal provided to the flip-flop. The flip-flop includes first and second latches. The transistor receives an inverted latched-enable signal from the clock-gating cell and switches ON or OFF based on the logic state of the inverted latched-enable signal. The transistor provides a voltage signal to the flip-flop circuit based on the state of the flip-flop in order to control the state of the flip-flop, which reduces power consumption of the integrated circuit.

20 Claims, 5 Drawing Sheets

LOW LEAKAGE FLIP-FLOP CIRCUIT

BACKGROUND OF THE INVENTION

The present invention generally relates to integrated circuits, and, more particularly, to a low leakage flip-flop circuit.

Integrated circuits (ICs) or chips such as system-on-chips (SoCs) have many digital circuit modules for performing various functions on a single chip. Power consumption in integrated circuits is a major concern, especially in handheld devices such as mobile phones, smart phones, laptops, cameras, personal digital assistants (PDAs), and tablets. With advancements in technology, more and more functionality is being implemented in an integrated circuit by increasing the number of transistors in the chip. This increase in the number of circuits increases power consumption and in the heat generated by the chip, which can adversely affect the performance of devices that include such chips.

One known technique to reduce power consumption is to configure the chip to operate in multiple power modes, such as high and low power modes. In the low power mode, one or more circuit modules are turned off. Another known technique is to have multiple, different power domains. For example, one power domain will operate at 5 v and another domain will operate at say 1.8 v.

One of the basic components of a digital module is a flip-flop. Flip-flops can be positive or negative edge-triggered. A positive edge-triggered flip-flop changes its output at a positive edge of a clock signal and a negative edge-triggered flip-flop changes its output at a negative edge of the clock signal.

Each power domain includes a power management unit (PMU). The PMUs control the power consumption of the flip-flops located within the respective power domains by setting the flip-flops in an active mode when the SoC is in the high power mode and setting the flip-flops in a sleep mode when the SoC is in the low-power mode, thereby reducing overall power consumption. However, due to the presence of multiple power domains, a power ramp up latency is introduced in the chip when the flip-flops are toggled between the active and sleep modes. Power ramp up latency refers to the time required to switch a voltage level of a signal from one voltage level to another. Power ramp up latency can reduce the overall performance of the chip, negating the benefit of the multiple power domains.

FIG. 1A is a schematic block diagram of a conventional IC 100 that includes a clock-gating cell 102 and a flip-flop 104. The IC 100 is operable in high and low power modes and includes high and low power domains (collectively not shown).

The clock-gating cell 102 includes a first latch 106 and an AND gate 108. The first latch 106 has an input terminal for receiving an enable signal ($V_{EN}$), a clock terminal for receiving a clock signal ($V_{CLK}$), a first power terminal for receiving a supply voltage signal ($V_{DD}$), a second power terminal connected to ground, and an output terminal for outputting a latched-enable signal ($V_{LEN}$). The enable signal ($V_{EN}$) is generated when the IC 100 toggles between the high and low power modes. For instance, when a user presses a sleep button of a smart phone to set the smart phone in a low power mode such as a sleep mode, a processor (not shown) of the IC 100 included in the smart phone generates the enable signal ($V_{EN}$) to deactivate logic circuits of the low power domain of the IC 100.

The first latch 106 is activated when the clock signal ($V_{CLK}$) is at a logic low state and deactivated when the clock signal ($V_{CLK}$) is at a logic high state.

The AND gate 108 has a first input terminal for receiving the clock signal ($V_{CLK}$), a second input terminal connected to the output terminal of the first latch 106 for receiving the latched-enable signal ($V_{LEN}$) and an output terminal for generating the gated-clock signal ($V_{GATED-CLK}$).

The flip-flop 104 includes second and third latches 110 and 112 and a NOT gate 114. The flip-flop 104 is a positive-edge triggered flip-flop. The second and third latches 110 and 112 operate in a master-slave configuration.

The second latch 110 operates as a master latch and has an input terminal for receiving an input signal ($V_{IN}$), a clock terminal connected to the output terminal of the AND gate 108 for receiving the gated-clock signal ($V_{GATED-CLK}$), a first power terminal for receiving the supply voltage signal ($V_{DD}$), a second power terminal connected to ground, and an output terminal for outputting an intermediate output signal ($V_{INT}$). The second latch 110 is activated when the gated-clock signal ($V_{GATED-CLK}$) is at a logic low state and deactivated when the gated-clock signal ($V_{GATED-CLK}$) is at a logic high state.

The third latch 112 operates as a slave latch and has an input terminal connected to the output terminal of the second latch 110 for receiving the intermediate output signal ($V_{INT}$) r a clock terminal connected to the output terminal of the AND gate 108 by way of the NOT gate 114 for receiving an inverted gated-clock signal ($V_{INV-GATED-CLK}$), a first power terminal for receiving the supply voltage signal ($V_{DD}$), a second power terminal connected to ground, and an output terminal for outputting an output signal ($V_{OUT}$). The third latch 112 is activated when the inverted gated-clock signal ($V_{INV-GATED-CLK}$) is at a logic low state and deactivated when the inverted gated-clock signal is at a logic high state.

FIG. 1B is a timing diagram illustrating the operation of the conventional IC 100. From $T_0$-$T_4$, the enable signal ($V_{EN}$) and the latched-enable signal ($V_{LEN}$) are at logic high states. Thus, the clock-gating cell 102 outputs the clock signal ($V_{CLK}$) as the gated-clock signal ($V_{GATED-CLK}$) from $T_0$-$T_4$. At time $T_4$, the enable signal ($V_{EN}$) and the latched-enable signal ($V_{LEN}$) toggle from high to low. Thus, the clock-gating cell 102 outputs the gated-clock signal ($V_{GATED-CLK}$) at a logic low state based on the latched-enable signal ($V_{LEN}$).

From $T_4$-$T_5$, the gated-clock signal ($V_{GATED-CLK}$) is at a logic low state, and hence, the second latch 110 is activated and the intermediate output signal ($V_{INT}$) is retained at the same state as the input signal ($V_{IN}$), i.e., the intermediate signal ($V_{INT}$) toggles to a logic high state. However, the third latch 112 receives the logic high inverted gated-clock signal ($V_{INV-GATED-CLK}$) and hence, is deactivated. The logic state of the output signal ($V_{OUT}$) remains same as the previous logic state, i.e., at a logic low state. Similarly, for $T_5$-$T_8$, the enable signal ($V_{EN}$) is low and hence, the intermediate signal follows the input signal ($V_{IN}$) and the output signal ($V_{OUT}$) does not change from $T_5$-$T_8$.

At the end of time period $T_7$-$T_8$, the enable signal ($V_{EN}$) toggles from low to high. Thus, after time $T_8$, the latched-enable signal ($V_{EN}$) toggles from low to high and the IC 100 operates the same as from time period $T_0$-$T_4$.

As described above, from $T_4$-$T_8$, the flip-flop 104 is deactivated, i.e., the third latch 112 is deactivated. However, the second latch 110 is active, thereby leading to unnecessary power consumption. The flip-flop 104 is deactivated when the gated-clock signal ($V_{GATED-CLK}$) is at the logic low state, i.e., when the clock signal ($V_{CLK}$) and enable signal ($V_{EN}$) are at logic low states. Subsequently, the PMU generates and provides the enable signal ($V_{EN}$) to the IC 100, thereby setting the IC 100 in the low-power mode.

SoCs include circuits that are functionally and structurally similar to the IC 100, and hence, each such circuit receives the enable signal ($V_{EN}$), i.e., the PMU deactivates the circuits when the SoC is in the low-power mode. As the circuits are structurally and functionally similar to the IC 100, the conventional technique does not leverage the SoC architecture and hence, does not provide optimized power solutions based on the SoC architecture. Further, toggling the flip-flops from the low power mode to the active mode introduces latency due to charging of internal components of the flip-flops. Examples of such internal components include internal capacitive or inductive nodes.

Therefore, it would be advantageous to have an integrated circuit with a flip-flop circuit that consumes less power and does not increase design complexities.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

Figure 1A:
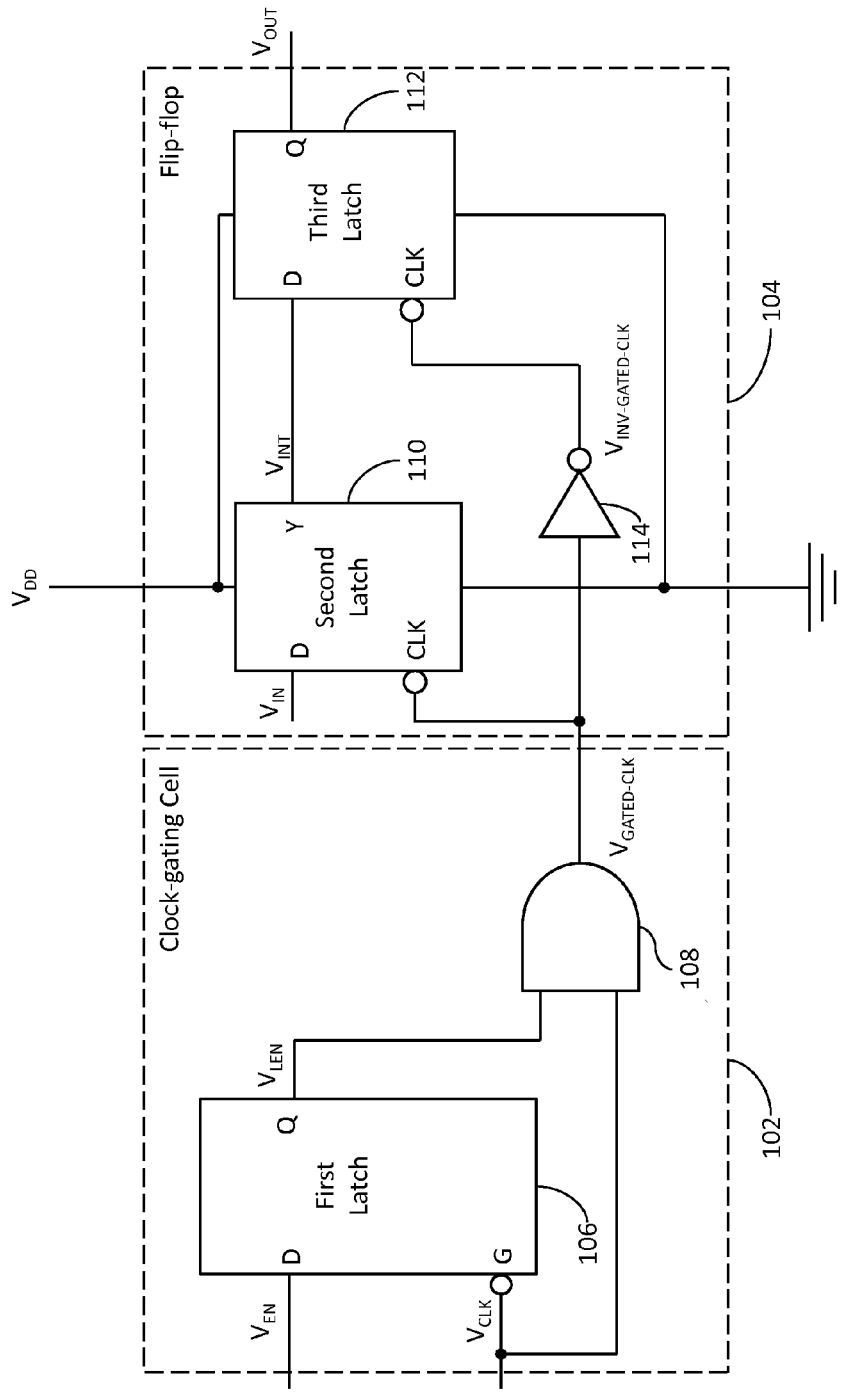
FIG. 1A is a schematic block diagram of a conventional integrated circuit.
Figure 1B:
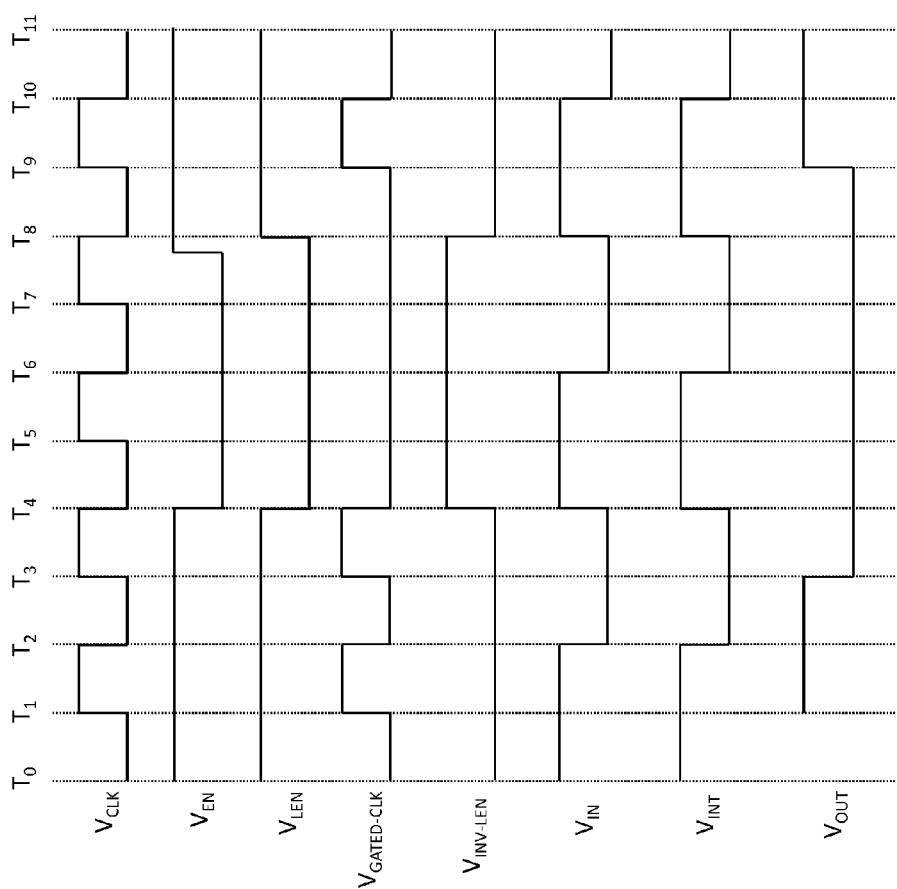
FIG. 1B is a timing diagram illustrating the operation of the conventional integrated circuit of FIG. 1A.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, an integrated circuit having reduced power consumption is provided. The IC includes a clock-gating cell, a transistor, and first and second latches. The clock-gating cell receives an enable signal and a clock signal and generates a gated-clock signal and a latched-enable signal. The transistor has a gate terminal connected to the clock-gating cell by way of a first NOT gate for receiving an inverted latched-enable signal, a first diffusion terminal for receiving a supply voltage signal, and a second diffusion terminal for providing the supply voltage signal when the inverted latched-enable signal is in a first logic state. The first latch has an input terminal for receiving an input signal, a first power terminal connected to the second diffusion terminal of the transistor for receiving the supply voltage signal, a second power terminal connected to ground, a clock terminal connected to the clock-gating cell for receiving the gated-clock signal, and an output terminal for outputting an intermediate output signal. The second latch has an input terminal connected to the output terminal of the second latch for receiving the intermediate output signal, a first power terminal for receiving the supply voltage signal, a second power terminal connected to ground, a clock terminal connected to the clock-gating cell by way of a second NOT gate for receiving an inverted gated-clock signal, and an output terminal for outputting an output signal.

In another embodiment of the present invention, an IC having reduced power consumption is provided. The IC includes a clock-gating cell, first and second latches, and a transistor. The clock-gating cell receives an enable signal and a clock signal and generates a gated-clock signal and a latched-enable signal. The first latch has an input terminal for receiving an input signal, a first power terminal for receiving a supply voltage signal, a clock terminal connected to the clock-gating cell for receiving the gated-clock signal, and an output terminal for outputting an intermediate output signal. The second latch has an input terminal connected to the output terminal of the first latch for receiving the intermediate output signal, a first power terminal for receiving the supply voltage signal, a second power terminal connected to ground, a clock terminal connected to the clock-gating cell by way of a first NOT gate for receiving an inverted gated-clock signal, and an output terminal for outputting an output signal. The transistor has a gate terminal connected to the clock-gating cell for receiving a latched-enable signal, a first diffusion terminal connected to a second power terminal of the first latch, and a second diffusion terminal connected to ground, wherein the transistor is switched on when the latched-enable signal is in a first logic state.

In yet another embodiment of the present invention, an IC having reduced power consumption is provided. The IC includes first, second and third latches, an AND gate, and a p-channel metal oxide semiconductor (PMOS) transistor. The first latch has an input terminal for receiving an enable signal, a first power terminal for receiving a supply voltage signal, a second power terminal connected to ground, a clock terminal for receiving a clock signal, and an output terminal for generating a latched-enable signal. The AND gate has a first input terminal connected to the output terminal of the first latch for receiving the latched-enable signal, a second input terminal for receiving the clock signal, and an output terminal for generating a gated-clock signal. The p-channel metal oxide semiconductor (PMOS) transistor has a gate terminal connected to the output terminal of the first latch by way of a first NOT gate for receiving an inverted latched-enable signal, a first diffusion terminal for receiving the supply voltage signal, and a second diffusion terminal for providing the supply voltage signal when the inverted latched-enable is in a first logic state. The second latch has an input terminal for receiving an input signal, a first power terminal connected to the second diffusion terminal of the PMOS transistor for receiving the supply voltage signal, a second power terminal connected to ground, a clock terminal connected to the output terminal of the AND gate for receiving the gated-clock signal, and an output terminal for outputting an intermediate output signal. The third latch has an input terminal connected to the output terminal of the second latch for receiving the intermediate output signal, a first power terminal for receiving the supply voltage signal, a second power terminal connected to ground, a clock terminal connected to the output terminal of the AND gate by way of a second NOT gate for receiving an inverted gated-clock signal, and an output terminal for outputting an output signal.

Various embodiments of the present invention provide an IC having reduced power consumption. The IC includes a clock-gating cell, a flip-flop circuit, and a transistor. The clock-gating cell includes a first latch and an AND gate. The flip-flop circuit includes second and third latches. The clock-gating cell receives an enable signal and a clock signal and generates a gated-clock signal and a latched-enable signal. The enable signal is a dynamic signal that is generated based on the design architecture of the IC. The transistor has a gate terminal for receiving an inverted latched-enable signal, a first diffusion terminal for receiving the supply voltage signal, and a second diffusion terminal for providing the supply voltage signal to the flip-flop circuit when the inverted latched-enable is at a first logic state. When the inverted latched-enable signal is at a second logic state, the transistor gates the supply voltage signal provided to the flip-flop circuit, thereby reducing the power consumption of the IC. Thus, the IC utilizes the enable signal, and hence, leverages the IC design architecture for reducing leakage power and power consumption of the IC. Further, multiple voltage or power domains are not required, thereby preventing any power ramp-up latency in the IC caused due to presence of the multiple voltage or power domains.

Figure 2A:
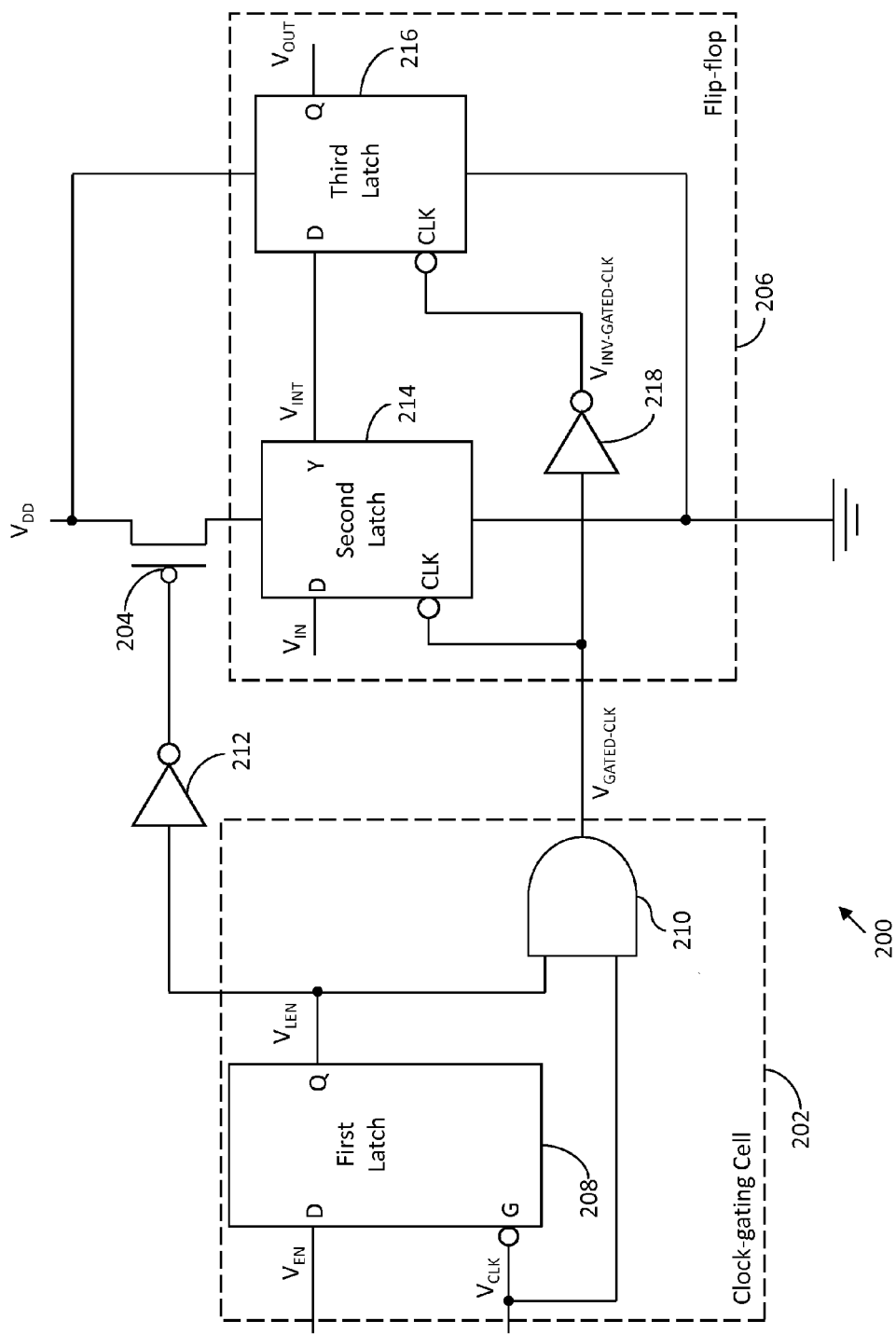
FIG. 2A is a schematic block diagram of an integrated circuit having reduced power consumption in accordance with an embodiment of the present invention.

Referring to FIG. 2A, a schematic block diagram of an IC 200 having reduced power consumption in accordance with an embodiment of the present invention is shown. The IC 200 includes a clock-gating cell 202, a PMOS transistor 204, and a flip-flop circuit 206. In an embodiment of the present invention, the IC 200 includes multiple clock-gating cells 202, PMOS transistors 204 and flip-flop circuits 206.

The clock-gating cell 202 includes a first latch 208 and an AND gate 210. The first latch 208 has an input terminal for receiving an enable signal ($V_{EN}$), a clock terminal for receiving a clock signal ($V_{CLK}$), and an output terminal for generating a latched-enable signal ($V_{LEN}$). For example, the IC 200 may include a controller (not shown) that generates the enable signal ($V_{EN}$) based on a design architecture of the IC 200. The controller identifies various logic circuits (not shown) such as flip-flop circuits of the IC 200 and generates the enable signal ($V_{EN}$) dynamically based on the operational requirement of the aforementioned logic circuits. Thus, the controller toggles the logic state of the enable signal ($V_{EN}$) to dynamically control the power consumption of the logic circuits, thereby reducing power consumption of the IC 200.

The AND gate 210 has a first input terminal connected to the output terminal of the first latch 208 for receiving the latched-enable signal ($V_{LEN}$), a second input terminal for receiving the clock signal ($V_{CLK}$), and an output terminal for generating a gated-clock signal ($V_{GATED-CLK}$).

The PMOS transistor 204 has a gate terminal connected to the output terminal of the first latch 208 by way of a first NOT gate 212 for receiving an inverted latched-enable signal ($V_{INV-LEN}$), a first diffusion terminal for receiving the supply voltage signal ($V_{DD}$), and a second diffusion terminal for providing the supply voltage signal ($V_{DD}$) when the inverted latched-enable signal ($V_{INV-LEN}$) is in a first logic state. The inverted latched-enable signal ($V_{INV-LEN}$ toggles between first and second logic states. Based on the logic state of the inverted latched-enable signal ($V_{INV-LEN}$), the PMOS transistor 204 switches ON or OFF. The PMOS transistor 204 switches ON and OFF when the inverted latched-enable signal is at the first and second logic states, respectively. In an embodiment of the present invention, the first and second diffusion terminals of the PMOS transistor 204 are source and drain terminals, respectively.

The flip-flop circuit 206 includes second and third latches 214 and 216, and a second NOT gate 218. The second and third latches 214 and 216 operate in a master-slave configuration. Thus, the second and third latches 214 and 216 are master and slave latches, respectively. The second latch 214 has an input terminal for receiving an input signal ($V_{IN}$), a first power terminal connected to the second diffusion terminal of the PMOS transistor 204 for receiving the supply voltage signal ($V_{DD}$), a second power terminal connected to ground, a clock terminal connected to the output terminal of the AND gate 210 for receiving the gated-clock signal ($V_{GATED-CLK}$), and an output terminal for outputting an intermediate output signal ($V_{INT}$). The third latch 216 has an input terminal connected to the output terminal of the second latch 214 for receiving the intermediate output signal ($V_{INT}$), a first power terminal for receiving the supply voltage signal ($V_{DD}$), a second power terminal connected to ground, a clock terminal connected to the output terminal of the AND gate 210 by way of the second NOT gate 218 for receiving an inverted gated-clock signal ($V_{INV-GATED-CLK}$), and an output terminal for outputting an output signal ($V_{OUT}$). In an embodiment of the present invention, the flip-flop circuit 206 is a positive edge-triggered flip-flop.

When the inverted latched-enable signal is at the first logic state, the PMOS transistor 204 switches ON, thereby providing the supply voltage signal ($V_{DD}$) to the second latch 214. When the inverted latched-enable signal is at the second logic state, the PMOS transistor 204 switches OFF, thereby gating the supply voltage signal ($V_{DD}$) provided to the second latch 214, and hence, switching off the second latch 214 to reduce the power consumption. In an embodiment of the present invention, the first logic state is a logic low state and the second logic state is a logic high state.

Figure 2B:
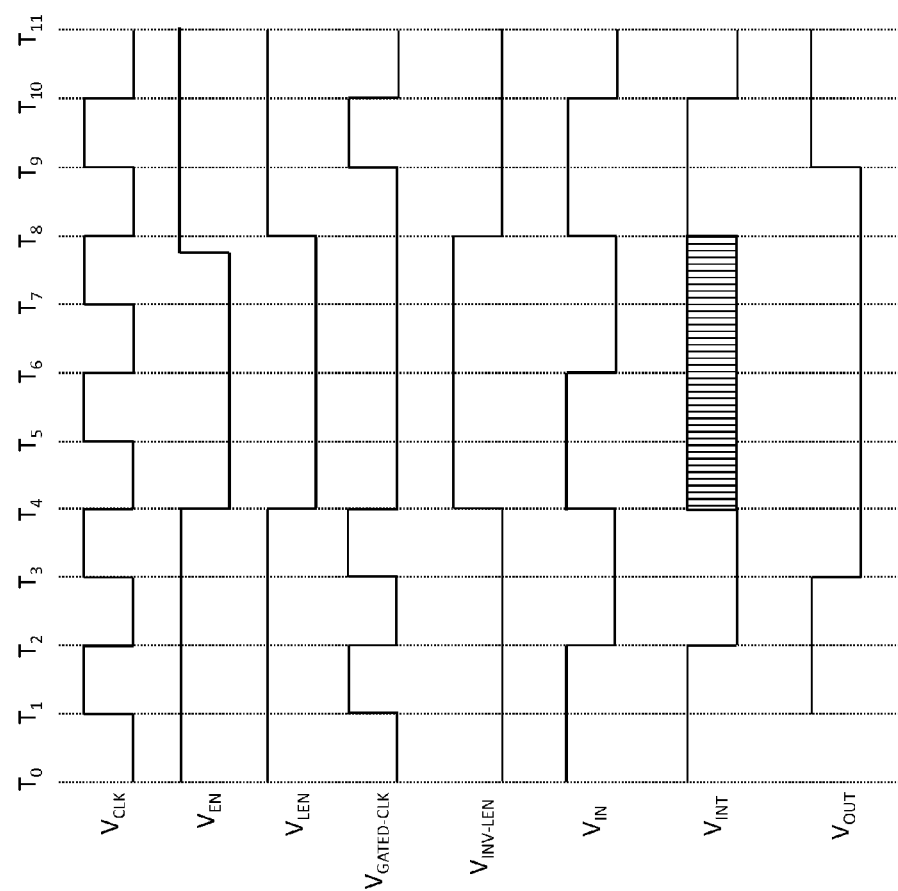
FIG. 2B is a timing diagram illustrating the operation of the integrated circuit of FIG. 2A in accordance with an embodiment of the present invention.

Referring now to FIG. 2B, a timing diagram illustrating the operation of the IC 200 is shown. In operation, during time period $T_0$-$T_4$, the enable signal ($V_{EN}$) is at a logic high state, and hence, the latched-enable signal ($V_{LEN}$) is at a logic high state. The AND gate 210 receives the logic high latched-enable signal ($V_{LEN}$) and outputs the clock signal ($V_{CLK}$) as the gated-clock signal ($V_{GATED-CLK}$). The PMOS transistor 204 receives the inverted latched-enable signal ($V_{INV-LEN}$) at logic low state and switches ON, thereby allowing normal operation of the second and third latches 214 and 216.

During time period $T_4$-$T_8$, the enable signal ($V_{EN}$) is set to a logic low state, and hence the latched-enable signal ($V_{LEN}$) is at logic low state. Thus, the AND gate 210 receives the logic low latched-enable signal ($V_{LEN}$) outputs the gated-clock signal ($V_{GATED-CLK}$) at logic low state. The PMOS transistor 204 receives the inverted latched-enable signal ($V_{LEN}$) at a logic high state and switches OFF, thereby gating the supply voltage signal ($V_{DD}$) provided to the first power terminal of the second latch 214. Thus, the second latch 214 is power-gated, and hence, switched OFF. As a result, the intermediate output signal ($V_{INT}$) is in a metastable state during the time period $T_4$-$T_8$ and hence, the logic state of the output signal ($V_{OUT}$) is retained at the logic state of the output signal ($V_{OUT}$) corresponding to the time period $T_3$-$T_4$.

At the end of time period $T_7$-$T_8$, the enable signal ($V_{EN}$) is set to a logic high state, and hence, the latched-enable signal ($V_{LEN}$) is at a logic high state. From time $T_8$-$T_{11}$, the PMOS transistor 204 receives the logic low inverted latched-enable signal ($V_{INV-LEN}$), and hence switches ON, thereby enabling normal operation of the second and third latches 214 and 216.

The IC 200 utilizes the enable signal ($V_{EN}$), and hence, leverages the design architecture of the IC 200 for reducing leakage power and power consumption of the IC 200. Further, multiple voltage or power domains are not required, thereby preventing any power ramp-up latency in the IC 200 caused due to the presence of the multiple voltage or power domains. Furthermore, the power consumed by the PMOS transistor 204 is compensated due to a stack effect of the second latch 214. Stack effect refers to the effects of internal node voltages of transistor stacks in logic cells such as latches and master-slave configuration flip-flops.

Figure 3:
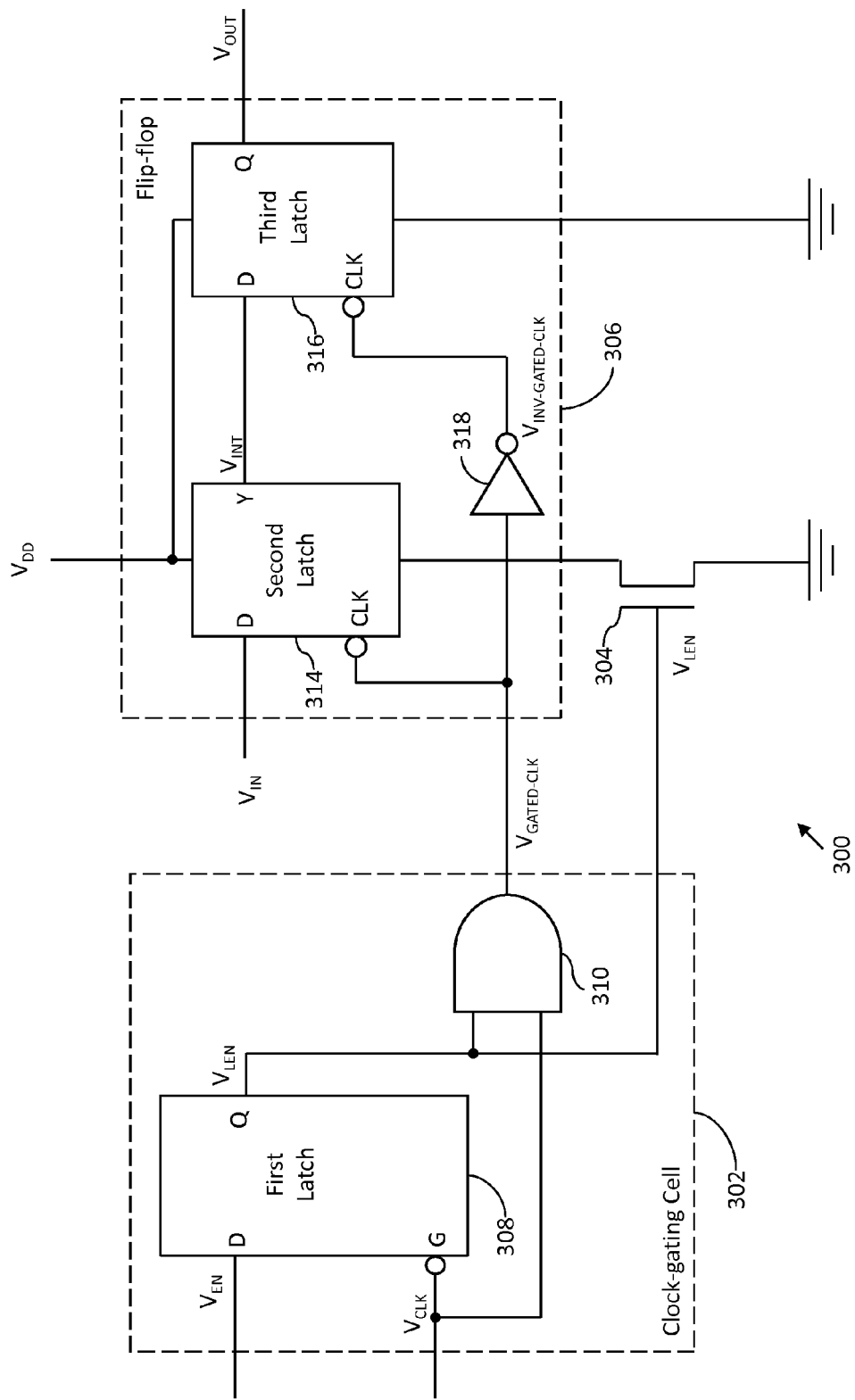
FIG. 3 is a block diagram of an integrated circuit having reduced power consumption in accordance with another embodiment of the present invention.

Referring now to FIG. 3, a block diagram of an integrated circuit (IC) 300 having reduced power consumption in accordance with another embodiment of the present invention is shown. The PMOS transistor 204 of IC 200 is replaced by an n-channel MOS (NMOS) transistor in the IC 300 for providing power gating. The IC 300 includes a clock-gating cell 302, an NMOS transistor 304 and a flip-flop circuit 306. In an embodiment of the present invention, the IC 300 includes multiple clock-gating cells 302, NMOS transistors 304 and flip-flop circuits 306.

The clock-gating cell 302 includes a first latch 308 and an AND gate 310. The clock-gating cell 302 is structurally and functionally similar to the clock-gating cell 202 of FIG. 2A.

The flip-flop circuit 306 includes second and third latches 314 and 316 and a first NOT gate 318. The second latch 314 has an input terminal for receiving an input signal ($V_{IN}$), a first power terminal for receiving a supply voltage signal ($V_{DD}$), a clock terminal connected to the clock-gating cell 302 for receiving the gated-clock signal ($V_{GATED-CLK}$), and an output terminal for outputting an intermediate output signal ($V_{INT}$).

The third latch 316 has an input terminal connected to the output terminal of the second latch 314 for receiving the intermediate output signal ($V_{INT}$), a first power terminal for receiving the supply voltage signal ($V_{DD}$), a second power terminal connected to ground, a clock terminal connected to the clock-gating cell 302 by way of the first NOT gate 318 for receiving an inverted gated-clock signal ($V_{INV-GATED-CLK}$), and an output terminal for outputting an output signal ($V_{OUT}$). The third latch 316 is structurally and functionally similar to the third latch 316 of FIG. 2A.

The NMOS transistor 304 has a gate terminal connected to the clock-gating cell 302 for receiving a latched-enable signal ($V_{LEN}$), a first diffusion terminal connected to a second power terminal of the second latch 314, and a second diffusion terminal connected to ground, wherein the NMOS transistor 304 is switched on when the latched-enable signal is at a first logic state. In an embodiment of the present invention, the first and second diffusion terminals of the NMOS transistor 304 are drain and source terminals, respectively.

The inverted latched-enable signal ($V_{INV-LEN}$) toggles between first and second logic states. Based on the logic state of the inverted latched-enable signal ($V_{INV-LEN}$), the NMOS transistor 304 switches ON or OFF. When the inverted latched-enable signal is at a first logic state, the NMOS transistor 304 switches ON thereby connecting the second latch 314 to the ground to allow normal operation of the second latch 314. When the inverted latched-enable signal ($V_{INV-LEN}$) is at a second logic state, the NMOS transistor 304 switches OFF thereby switching off the second latch 314 to reduce the power consumption of the IC 300. In an embodiment of the invention, the first logic state is a logic high state and the second logic state is a logic low state.

It will be understood by those of skill in the art that in another embodiment of the present invention, an IC having reduced power consumption includes the flip-flop circuit 206 of FIG. 2A, the PMOS transistor 204 of FIG. 2A, and the NMOS transistor 304 of FIG. 3. A master latch of the flip-flop circuit 206 has a first power terminal for receiving the supply voltage signal ($V_{DD}$) by way of the PMOS transistor 204 and a second power terminal connected to ground by way of the NMOS transistor 304. The latched-enable signal ($V_{LEN}$) controls the operation modes of the PMOS and NMOS transistors 204 and 304, thereby switching ON or OFF the aforementioned transistors and reducing power consumption of IC that includes the flip-flop circuit 206.

In an embodiment of the present invention, the first and third latches 208 and 216 are negative-level sensitive latches and the second latch 214 is a positive-level sensitive latch. In another embodiment of the present invention, the first and third latches 208 and 216 are positive-level sensitive latches and the second latch 214 is a negative-level sensitive latch. In another embodiment of the present invention, the first, second, and third latches 208, 214, and 216 are D-type latches.

It will be further understood by those of skill in the art that the same logical function may be performed by different arrangements of logic gates, or that logic circuits operate using either positive or negative logic signals. Therefore, variations in the arrangement of some of the logic gates described above should not be considered to depart from the scope of the present invention.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. An integrated circuit, comprising:
   a clock-gating cell for receiving an enable signal and a clock signal and generating a gated-clock signal and a latched-enable signal;
   a transistor having a gate terminal connected to the clock-gating cell by way of a first NOT gate for receiving an inverted latched-enable signal, a first diffusion terminal for receiving a supply voltage signal, and a second diffusion terminal for providing the supply voltage signal when the inverted latched-enable signal is in a first logic state;
   a first latch having an input terminal for receiving an input signal, a first power terminal connected to the second diffusion terminal of the transistor for receiving the supply voltage signal, a second power terminal connected to ground, a clock terminal connected to the clock-gating cell for receiving the gated-clock signal, and an output terminal for outputting an intermediate output signal; and
   a second latch having an input terminal connected to the output terminal of the first latch for receiving the intermediate output signal, a first power terminal for receiving the supply voltage signal, a second power terminal connected to ground, a clock terminal connected to the clock-gating cell by way of a second NOT gate for receiving an inverted gated-clock signal, and an output terminal for outputting an output signal.

2. The integrated circuit of claim 1, wherein the clock-gating cell comprises:
   a third latch having an input terminal for receiving the enable signal, a first power terminal for receiving the supply voltage signal, a second power terminal connected to ground, a clock terminal for receiving the clock signal, and an output terminal for outputting the latched-enable signal; and
   an AND gate having a first input terminal connected to the output terminal of the third latch for receiving the latched-enable signal, a second input terminal for receiving the clock signal, and an output terminal for generating the gated-clock signal.

3. The integrated circuit of claim 2, wherein the first and third latches each comprise a negative level-sensitive latch and the second latch comprises a positive level-sensitive latch.

4. The integrated circuit of claim 2, wherein the first and third latches each comprise a positive level-sensitive latch and the second latch comprises a negative level-sensitive latch.

5. The integrated circuit of claim 2, wherein the first, second and third latches each comprise a D-type latch.

6. The integrated circuit of claim 1, wherein the transistor is switched off when the inverted latched-enable signal is in a second logic state, thereby switching off the first latch.

7. The integrated circuit of claim 6, wherein the first logic state is a logic low state and the second logic state is a logic high state.

8. The integrated circuit of claim 1, wherein the transistor comprises a p-channel metal-oxide semiconductor (PMOS) transistor.

9. An integrated circuit, comprising:
- a clock-gating cell for receiving an enable signal and a clock signal and generating a gated-clock signal and a latched-enable signal;
- a first latch having an input terminal for receiving an input signal, a first power terminal for receiving a supply voltage signal, a clock terminal connected to the clock-gating cell for receiving the gated-clock signal, and an output terminal for outputting an intermediate output signal;
- a second latch having an input terminal connected to the output terminal of the first latch for receiving the intermediate output signal, a first power terminal for receiving the supply voltage signal, a second power terminal connected to ground, a clock terminal connected to the clock-gating cell by way of a first NOT gate for receiving an inverted gated-clock signal, and an output terminal for outputting an output signal; and
- a transistor having a gate terminal connected to the clock-gating cell for receiving a latched-enable signal, a first diffusion terminal connected to a second power terminal of the first latch, and a second diffusion terminal connected to ground, wherein the transistor is switched on when the latched-enable signal is in a first logic state.

10. The integrated circuit of claim 9, wherein the clock-gating cell comprises:
- a third latch having an input terminal for receiving the enable signal, a first power terminal for receiving the supply voltage signal, a second power terminal connected to ground, a clock terminal for receiving the clock signal, and an output terminal for outputting the latched-enable signal; and
- an AND gate having a first input terminal connected to the output terminal of the third latch for receiving the latched-enable signal, a second input terminal for receiving the clock signal, and an output terminal for generating the gated-clock signal.

11. The integrated circuit of claim 10, wherein the first and third latches each comprise a negative level-sensitive latch and the second latch comprises a positive level-sensitive latch.

12. The integrated circuit of claim 10, wherein the first, second and third latches each comprise a D-type latch.

13. The integrated circuit of claim 9, wherein the transistor is switched off when the latched-enable signal is in a second logic state thereby switching off the first latch.

14. The integrated circuit of claim 13, wherein the first logic state is a logic high state and the second logic state is a logic low state.

15. The integrated circuit of claim 9, wherein the transistor is an n-channel metal-oxide semiconductor (NMOS) transistor.

16. An integrated circuit, comprising:
- a first latch having an input terminal for receiving an enable signal, a first power terminal for receiving a supply voltage signal, a second power terminal connected to ground, a clock terminal for receiving a clock signal, and an output terminal for generating a latched-enable signal;
- an AND gate having a first input terminal connected to the output terminal of the first latch for receiving the latched-enable signal, a second input terminal for receiving the clock signal, and an output terminal for generating a gated-clock signal;
- a p-channel metal oxide semiconductor (PMOS) transistor having a gate terminal connected to the output terminal of the first latch by way of a first NOT gate for receiving an inverted latched-enable signal, a first diffusion terminal for receiving the supply voltage signal, and a second diffusion terminal for providing the supply voltage signal when the inverted latched-enable is in a first logic state;
- a second latch having an input terminal for receiving an input signal, a first power terminal connected to the second diffusion terminal of the PMOS transistor for receiving the supply voltage signal, a second power terminal connected to ground, a clock terminal connected to the output terminal of the AND gate for receiving the gated-clock signal, and an output terminal for outputting an intermediate output signal; and
- a third latch having an input terminal connected to the output terminal of the second latch for receiving the intermediate output signal, a first power terminal for receiving the supply voltage signal, a second power terminal connected to ground, a clock terminal connected to the output terminal of the AND gate by way of a second NOT gate for receiving an inverted gated-clock signal, and an output terminal for outputting an output signal.

17. The integrated circuit of claim 16, wherein the first and second latches each comprise a negative level-sensitive latch and the third latch comprises a positive level-sensitive latch.

18. The integrated circuit of claim 16, wherein the first, second and third latches each comprise a D-type latch.

19. The integrated circuit of claim 16, wherein the PMOS transistor is switched off when the inverted latched-enable signal is in a second logic state, thereby switching off the second latch.

20. The integrated circuit of claim 19, wherein the first logic state is a logic low state and the second logic state is a logic high state.

* * * * *